US010090824B2

(12) United States Patent
Nakahashi

(10) Patent No.: US 10,090,824 B2
(45) Date of Patent: Oct. 2, 2018

(54) FILTER APPARATUS

(71) Applicant: Murata Manufacturing Co., Ltd., Nagaokakyo-shi, Kyoto-fu (JP)

(72) Inventor: Norihiko Nakahashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 183 days.

(21) Appl. No.: 15/166,434

(22) Filed: May 27, 2016

(65) Prior Publication Data

US 2016/0277002 A1 Sep. 22, 2016

Related U.S. Application Data

(63) Continuation of application No. PCT/JP2014/074533, filed on Sep. 17, 2014.

(30) Foreign Application Priority Data

Dec. 3, 2013 (JP) ................................ 2013-250297

(51) Int. Cl.

| | |
|---|---|
| ***H03H 9/54*** | (2006.01) |
| ***H03H 9/64*** | (2006.01) |
| ***H03H 9/56*** | (2006.01) |
| ***H03H 9/60*** | (2006.01) |
| ***H03H 9/00*** | (2006.01) |

(52) U.S. Cl.

CPC .......... *H03H 9/542* (2013.01); *H03H 9/0009* (2013.01); *H03H 9/568* (2013.01); *H03H 9/605* (2013.01); *H03H 9/64* (2013.01); *H03H 9/6483* (2013.01)

(58) Field of Classification Search

CPC ...... H03H 9/0009; H03H 9/542; H03H 9/568; H03H 9/605; H03H 9/64; H03H 9/6483
USPC ......................... 333/133, 187, 188, 193–196
See application file for complete search history.

(56) References Cited

U.S. PATENT DOCUMENTS

| | | | |
|---|---|---|---|
| 5,963,113 | A | 10/1999 | Ou et al. |
| 6,404,302 | B1 | 6/2002 | Satoh et al. |
| 2007/0159274 | A1 | 7/2007 | Onzuka |
| 2007/0247259 | A1 | 10/2007 | Takata |

FOREIGN PATENT DOCUMENTS

| | | | |
|---|---|---|---|
| JP | 10-13187 | A | 1/1998 |
| JP | 10-303695 | A | 11/1998 |
| JP | 11-46126 | A | 2/1999 |
| JP | 2007-202136 | A | 8/2007 |
| JP | 2010-87586 | A | 4/2010 |
| WO | 00/30252 | A1 | 5/2000 |
| WO | 2006/067935 | A1 | 6/2006 |

OTHER PUBLICATIONS

Official Communication issued in International Application PCT/JP2014/074533, dated Dec. 16, 2014.

*Primary Examiner* — Robert J Pascal
*Assistant Examiner* — Jorge Salazar, Jr.
(74) *Attorney, Agent, or Firm* — Keating & Bennett, LLP

(57) ABSTRACT

A filter apparatus includes a plurality of stages of ladder circuits connected between an input terminal and an output terminal, and a band width ratio is about 4.3 % or higher. The ladder circuits of respective stages include series arm resonators, parallel arm resonators, first inductors respectively connected between a ground potential and first end portions, and second inductors respectively connected between the ground potential and second end portions.

15 Claims, 5 Drawing Sheets

1 101 101a 101b 11 102 103 201a 201 201b 202 203 12 301 304 104 105 106 302 303 204 205 206

FILTER APPARATUS

BACKGROUND OF THE INVENTION

1. Field of the Invention

The present invention relates to a band pass filter apparatus, and more specifically to a filter apparatus including a ladder circuit.

2. Description of the Related Art

Ladder filters are widely used as band pass filters. For example, Japanese Unexamined Patent Application Publication No. 11-46126 discloses an example of a ladder filter apparatus. In Japanese Unexamined Patent Application Publication No. 11-46126, series arm resonators and parallel arm resonators are formed of surface acoustic wave resonators. A matching inductor is connected between an input terminal and a surface acoustic wave resonator closest to the input terminal. A matching inductor is connected between an output terminal and a series arm resonator closest to the output terminal.

In a ladder filter apparatus, it is necessary to increase a frequency interval between the resonant frequency of a parallel arm resonator and the anti-resonant frequency of a series arm resonator in order to widen a band. However, when the frequency interval is increased too much, it becomes difficult to perform impedance matching at input/output terminals.

In Japanese Unexamined Patent Application Publication No. 11-46126, matching inductors are connected to input/output terminals. However, due to connection of the matching inductors described above, impedance matching can be performed only in the case where the band width ratio is 4% or less. When the band is widened more than that, insertion loss in the pass band is increased and a ripple in the pass band is increased. Further, there is a problem in that the VSWR characteristics are degraded.

SUMMARY OF THE INVENTION

Preferred embodiments of the present invention provide a filter apparatus which has filter characteristics with a band width ratio of more than about 4%, where insertion loss or degradation of the VSWR characteristics is unlikely to be generated and a ripple in the pass band is significantly reduced or prevented.

A filter apparatus according to a preferred embodiment of the present invention includes an input terminal; an output terminal; and a plurality of stages of ladder circuits connected between the input terminal and the output terminal. A band width ratio of the filter apparatus according to a preferred embodiment of the present invention preferably is about 4.3% or higher, for example. In a preferred embodiment of the present invention, a ladder circuit of each stage of the plurality of stages of ladder circuits includes a first end portion; a second end portion; a series arm resonator provided on a series arm connecting the first end portion and the second end portion to each other; a parallel arm resonator provided on a parallel arm connecting the series arm to a ground potential a first inductor connected between the first end portion and the ground potential; and a second inductor connected between the second end portion and the ground potential.

In a specific aspect of a filter apparatus according to various preferred embodiments of the present invention, in the ladder circuits neighboring each other among the plurality of stages of ladder circuits, the second inductor of one of the ladder circuits and the first inductor of the other of the ladder circuits are integrated into a single common inductor.

In another specific aspect of a filter apparatus according to various preferred embodiments of the present invention, the filter apparatus includes the plurality of stages of ladder circuits whose impedances are a complex conjugate of each other.

In still another specific aspect of a filter apparatus according to a preferred embodiment of the present invention, a ground-potential-side end portion of the first inductor and a ground-potential-side end portion of the second inductor are commonly connected to each other at a first common connection point and a third inductor is connected between the first common connection point and the ground potential such that the first inductor and the second inductor are magnetically coupled to each other.

In still another specific aspect of a filter apparatus according to various preferred embodiments of the present invention, the ladder circuit of each stage of the plurality of stages of ladder circuits includes a plurality of the parallel arms, each of the parallel arms includes the parallel arm resonator provided thereon, ground-potential-side end portions of the parallel arm resonators provided on at least two of the parallel arms are commonly connected to one another at a second common connection point, and a fourth inductor is connected between the second common connection point and the ground potential.

In still another specific aspect of a filter apparatus according to various preferred embodiments of the present invention, a frequency of an attenuation pole generated by the magnetic coupling between the first inductor and the second inductor is lower than a center frequency of a pass band.

In another specific aspect of a filter apparatus according to a preferred embodiment of the present invention, the series arm resonators and the parallel arm resonators include elastic wave resonators.

According to a filter apparatus according to a preferred embodiment of the present invention, although the band width ratio of the pass band has been increased to about 4.3% or higher, insertion loss within a pass band is significantly reduced or prevented. Degradation of the VSWR characteristics is unlikely to be generated. Further, a ripple within the pass band is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings.

Figure 1:
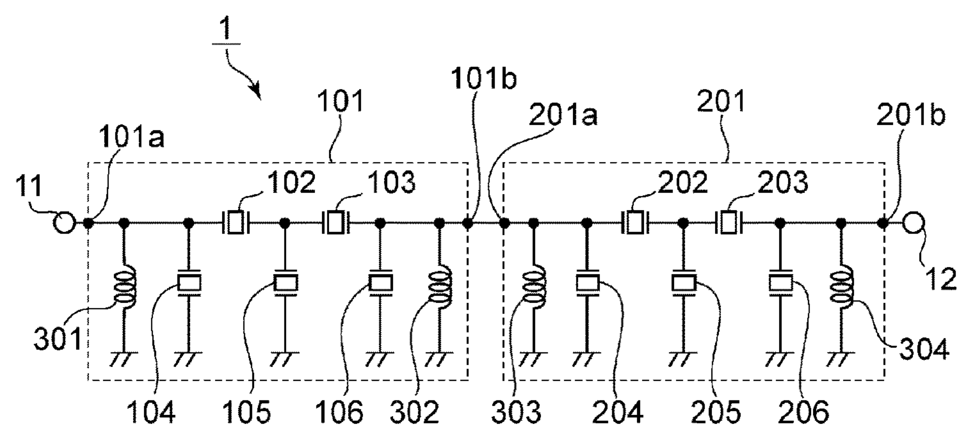
FIG. 1 is a circuit diagram of a filter apparatus according to a first preferred embodiment of the present invention.

FIG. 1 is a circuit diagram of a filter apparatus according to a first preferred embodiment of the present invention. A filter apparatus 1 includes an input terminal 11 and an output terminal 12. A plurality of stages of ladder circuits 101 and 201 are connected in series between the input terminal 11 and the output terminal 12.

In the present preferred embodiment, a first ladder circuit 101 and a second ladder circuit 201 are connected to each other.

The ladder circuit 101 includes a first end portion 101*a* connected to the input terminal 11 and a second end portion 101*b* provided opposite to the first end portion 101*a*. A plurality of series arm resonators 102 and 103 are located on a series arm connecting the first end portion 101*a* and the second end portion 101*b* to each other. The plurality of series arm resonators 102 and 103 are connected in series with each other.

A plurality of parallel arms connecting the series arm to a ground potential are provided. In other words, a first parallel arm on which a parallel arm resonator 104 is provided, a second parallel arm on which a parallel arm resonator 105 is provided, and a third parallel arm on which a parallel arm resonator 106 is provided are provided.

The series arm resonators 102 and 103 and the parallel arm resonators 104-106 include surface acoustic wave resonators. However, the series arm resonators 102 and 103 and the parallel arm resonators 104-106 may include other elastic wave resonators, such as boundary acoustic wave resonators.

A first inductor 301 is connected between the first end portion 101*a* and the ground potential. A second inductor 302 is connected between the second end portion 101*b* and the ground potential.

The ladder circuit 201 is configured similarly to the ladder circuit 101. In other words, the ladder circuit 201 includes a first end portion 201*a* and a second end portion 201*b* provided opposite to the first end portion 201*a*. The first end portion 201*a* is connected to the second end portion 101*b* of the first ladder circuit 101. Series arm resonators 202 and 203 are provided on the series arm connecting the first end portion 201*a* and the second end portion 201*b* to each other. The second end portion 201*b* is connected to the output terminal 12.

The ladder circuit 201 also includes a first parallel arm to which a parallel arm resonator 204 is connected, a second parallel arm including a parallel arm resonator 205, and a third parallel arm including a parallel arm resonator 206. A first inductor 303 is connected between the first end portion 201*a* and the ground potential, and a second inductor 304 is connected between the second end portion 201*b* and the ground potential.

In the filter apparatus 1 of the present preferred embodiment, the band width ratio preferably is about 4.3% or higher, for example. Note that the band width ratio is a ratio given by the frequency range of a pass band in the filter apparatus 1 divided by the center frequency. As is well known, a ladder filter includes attenuation poles at resonant frequencies of parallel arm resonators and anti-resonant frequencies of series arm resonators. The anti-resonant frequencies of the parallel arm resonators and the resonant frequencies of the series arm resonators are located within a pass band. With such a configuration, there is a problem in that bandpass characteristics tend to be degraded when the band width ratio exceeds 4%, as described above. Specifically, it is assumed that, for the value A of the resonant frequency of the parallel arm resonator forming the attenuation pole at a lower frequency than the pass band of a filter, the value B of the anti-resonant frequency of the parallel arm resonator forming an attenuation pole at a higher frequency than the pass band of the filter, and a difference B−A, the interim value of the anti-resonant frequency of the series arm resonator and the resonant frequency of the parallel arm resonator is (A+B)/2. When the ratio 2(B−A)/(A+B) of the interim value over the difference is 6% or higher, there is a tendency for the insertion loss characteristics within a pass band to degrade, and consequently, a wider pass band cannot be realized. Note that in the case where there are a plurality of series arm resonators and parallel arm resonators defining the pass band of the filter, the average of the anti-resonant frequencies and the average of the resonant frequencies may be respectively used for the anti-resonant frequency and the resonant frequency described above. The pass band may be defined as being a range corresponding to insertion loss of 0 dB to 3.0 dB.

Figure 2:
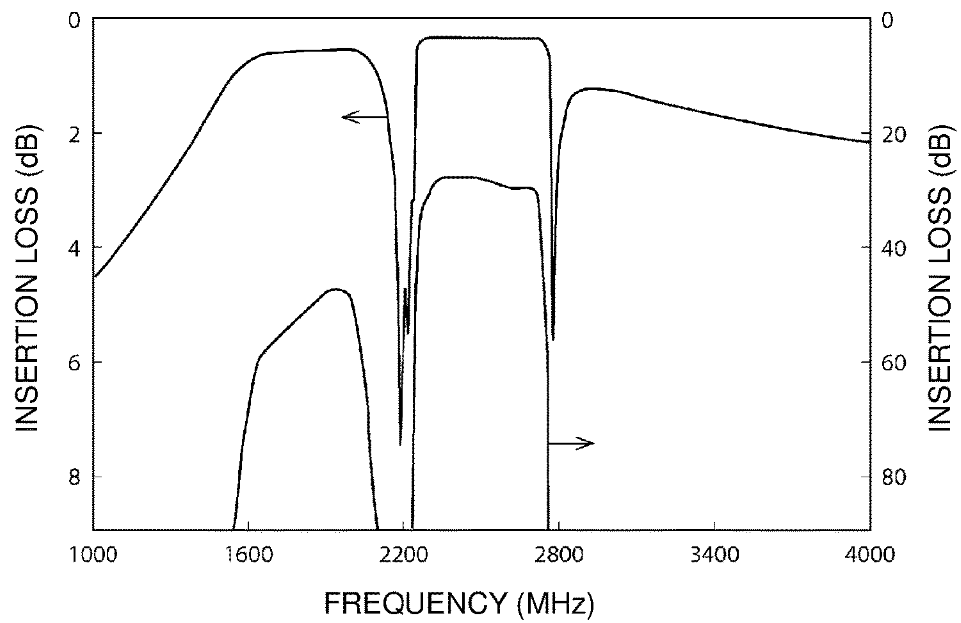
FIG. 2 is a diagram illustrating attenuation frequency characteristics of the filter apparatus of the first preferred embodiment of the present invention.

In contrast, in the filter apparatus 1, the ladder circuit 101 including the first inductor 301 and the second inductor 302 and the ladder circuit 201 including the first inductor 303 and the second inductor 304 are connected to each other. The first inductor 301 and the second inductor 304 have functions of performing impedance matching respectively with the input terminal 11 and the output terminal 12. The second inductor 302 and the first inductor 303 have functions of performing impedance matching respectively with the second end portion 101*b* and the first end portion 201*a*. In this way, impedance matching is performed not only at the input terminal 11 and the output terminal 12 but also at the second end portion 101*b* and the first end portion 201*a* allows insertion loss within the pass band to be reduced although the band width ratio is large. In addition, degradation of the VSWR characteristics is unlikely to be generated. Further, a ripple in the pass band is effectively reduced or prevented. This will be described with reference to FIG. 2 to FIG. 4.

A filter apparatus of Example 1 below was made as an example of the filter apparatus 1 of the first preferred embodiment of the present invention. The pass band of the filter apparatus of Example 1 was made to be 2300 MHz to 2690 MHz. The center frequency is 2495 MHz. Hence, the band width ratio is (390/2495)×100%=15.6%. Application of a preferred embodiment of the present invention realizes the filter apparatus 1 that has low insertion loss within the pass band and that has a band width ratio of 12% or higher, i.e., three times or more higher than 4%, which was the upper limit of a large band width ratio obtained through application of an existing technique.

To make the filter apparatus 1 having the pass band and the band width ratio described above, the design parameters of the series arm resonators 102, 103, 202, and 203, the parallel arm resonators 104-106 and 204-206, the first inductors 301 and 303, and the second inductors 302 and 304 were set as follows.

TABLE 1

| | SERIES ARM RESONATORS | | PARALLEL ARM RESONATORS | | | SERIES ARM RESONATORS | | PARALLEL ARM RESONATORS | | |
|---|---|---|---|---|---|---|---|---|---|---|
| | 102 | 103 | 104 | 105 | 106 | 202 | 203 | 204 | 205 | 206 |
| CAPACITANCE (pF) | 3.1 | 4.1 | 2.0 | 1.1 | 1.7 | 4.1 | 3.1 | 1.7 | 1.1 | 2.0 |
| RESONANT FREQUENCY (MHz) | 2698 | 2688 | 2188 | 2234 | 2215 | 2688 | 2695 | 2215 | 2234 | 2188 |

TABLE 2

| INDUCTOR | 301 | 302 | 303 | 304 |
|---|---|---|---|---|
| INDUCTANCE VALUE (nH) | 1.5 | 2.0 | 2.0 | 1.5 |

The attenuation frequency characteristics of the filter apparatus 1 designed as described above, are illustrated in FIG. 2. As is clear from FIG. 2, it can be seen that a pass band of 2300 MHz to 2690 MHz is formed and, further, the insertion loss in the pass band is sufficiently low, as low as below 3 dB. In addition, it can be seen that a large ripple does not appear in the pass band.

Figure 3:
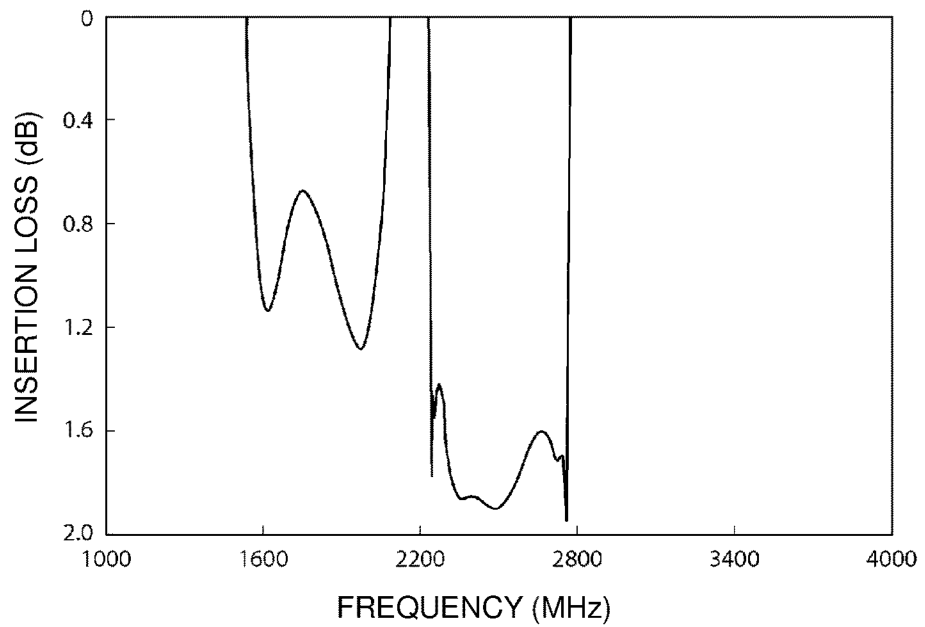
FIG. 3 is a diagram illustrating VSWR characteristics of the filter apparatus of the first preferred embodiment of the present invention.
Figure 4:
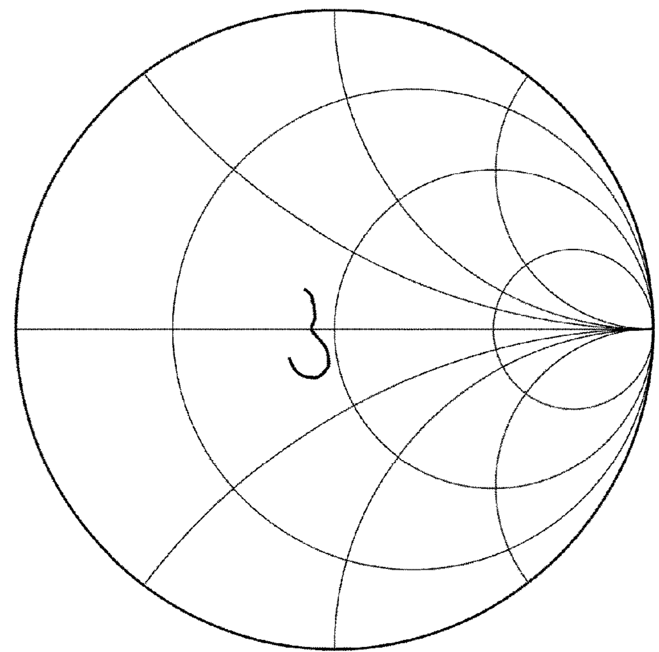
FIG. 4 is a diagram illustrating an impedance Smith chart of the filter apparatus of the first preferred embodiment of the present invention.

FIG. 3 is a diagram illustrating the reflection characteristics, as VSWR characteristics, when the first ladder circuit is seen from the connection portion between the first and second ladder circuits in the filter apparatus of Example 1 described above. It can be seen from FIG. 3 that the VSWR characteristics are not degraded either. FIG. 4 is a diagram illustrating an impedance Smith chart on the input terminal side of the filter apparatus of Example 1 described above. As is clear from FIG. 4, it can be seen that impedance matching is sufficiently performed. Note that it has also been confirmed that impedance matching is sufficiently performed on the output terminal side.

In the first preferred embodiment, the reason why the characteristics are favorable even in the widened band is thought to be that the impedance matching between the first ladder circuit 101 and the second ladder circuit 201 is favorable. This point will be described in more detail in a second preferred embodiment described below.

Figure 5:
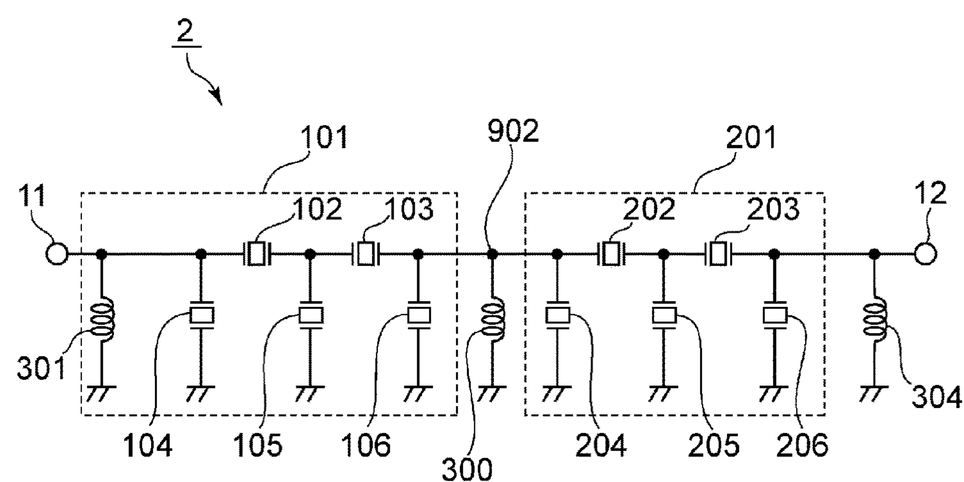
FIG. 5 is a circuit diagram of a filter apparatus according to a second preferred embodiment of the present invention.

FIG. 5 is a circuit diagram of a filter apparatus according to a second preferred embodiment of the present invention. In a filter apparatus 2 of the second preferred embodiment, the second inductor 302 of about 2.0 nH included in the first ladder circuit 101 in the filter apparatus 1 of the first preferred embodiment and the first inductor 303 of about 2.0 nH included in the second ladder circuit 201 in the filter apparatus 1 of the first preferred embodiment are integrated into a common inductor 300 of about 1.0 nH, for example. When an inductor of about 2.0 nH and an inductor of about 2.0 nH are connected in parallel with each other, the composite inductor is about 1.0 nH on the basis of equivalent circuit theory. The second inductor 302 included in the first ladder circuit 101 in the filter apparatus 1 of the first preferred embodiment and the first inductor 303 included in the second ladder circuit 201 in the filter apparatus 1 of the first preferred embodiment are connected in parallel with each other and are both connected to the series arm and the ground potential and, hence are able to be easily integrated into the common inductor 300. In other points, the filter apparatus 2 is the same as the filter apparatus 1 of the first preferred embodiment. Hence, identical portions are denoted by the same reference numerals and descriptions thereof are omitted.

As in the present preferred embodiment, in the plurality of stages of the ladder circuits 101 and 201, the second inductor of the one ladder circuit 101 and the first inductor of the other ladder circuit 201 neighboring each other may be integrated into the common inductor 300. The inductance values of the first inductor 301 and the second inductor 304 need not be changed due to integration into the common inductor 300.

In the present preferred embodiment, the filter apparatus 2 preferably has a two-stage configuration and, hence, the second inductor and the first inductor are integrated into a common inductor between the first ladder circuit 101 and the second ladder circuit 201. In the case of a filter apparatus with three stages or more, there is no need to integrate the second inductor and the first inductor in each of the portions between neighboring ladder circuits. In other words, a configuration may be used in which the second inductor and the first inductor that neighbor each other are integrated into a common inductor in at least one of the plurality of portions where the ladder circuits neighbor each other, as in the present preferred embodiment. Reduction in size due to a reduction in wiring lines is able to be realized by integration of the inductors.

The filter apparatus 2 of the present preferred embodiment is the same as the filter apparatus 1 of the first preferred embodiment except for the shared common inductor 300 and, hence, allows favorable filter characteristics to be realized even in the case where the band is widened, similarly to the first preferred embodiment. This will be described more specifically with reference to FIG. 6 to FIG. 8.

A filter apparatus of Example 2 below was designed as an example of the filter apparatus 2 of the second preferred embodiment.

A band pass filter for Band 41 for TDD was designed. The pass band was made to be 2496 MHz to 2690 MHz. The center frequency is 2598 MHz. Hence, the band width ratio=((2690−2496)/2598)×100%=7.5%. Therefore, the filter apparatus 2 obtains the bandpass characteristics with a wide band width ratio of 7.0% or higher and a low insertion loss of 3.0 dB or lower.

Also in Example 2 described above, the series arm resonators 102, 103, 202, and 203 and the parallel arm resonators 104-106 and 204-206 were formed of surface acoustic wave resonators similarly to Example 1. The design parameters of the surface acoustic wave resonators and the design parameters of the inductors 301, 300, and 304 in Example 2 are illustrated in Table 3 and Table 4 described below.

TABLE 3

| | SERIES ARM RESONATORS | | PARALLEL ARM RESONATORS | | | SERIES ARM RESONATORS | | PARALLEL ARM RESONATORS | | |
|---|---|---|---|---|---|---|---|---|---|---|
| | 102 | 103 | 104 | 105 | 106 | 202 | 203 | 204 | 205 | 206 |
| CAPACITANCE (pF) | 1.6 | 2.5 | 2.3 | 1.2 | 1.6 | 2.5 | 1.6 | 1.6 | 1.2 | 2.3 |
| RESONANT FREQUENCY (MHz) | 2656 | 2648 | 2428 | 2477 | 2456 | 2648 | 2656 | 2456 | 2477 | 2428 |

TABLE 4

| INDUCTOR | 301 | 300 | 304 |
|---|---|---|---|
| INDUCTANCE VALUE (nH) | 1.9 | 1.5 | 1.9 |

For comparison, a filter apparatus of a comparative example was prepared. The comparative example is the same as Example 2 described above except that the comparative example does not include the common inductor 300.

Figure 7:
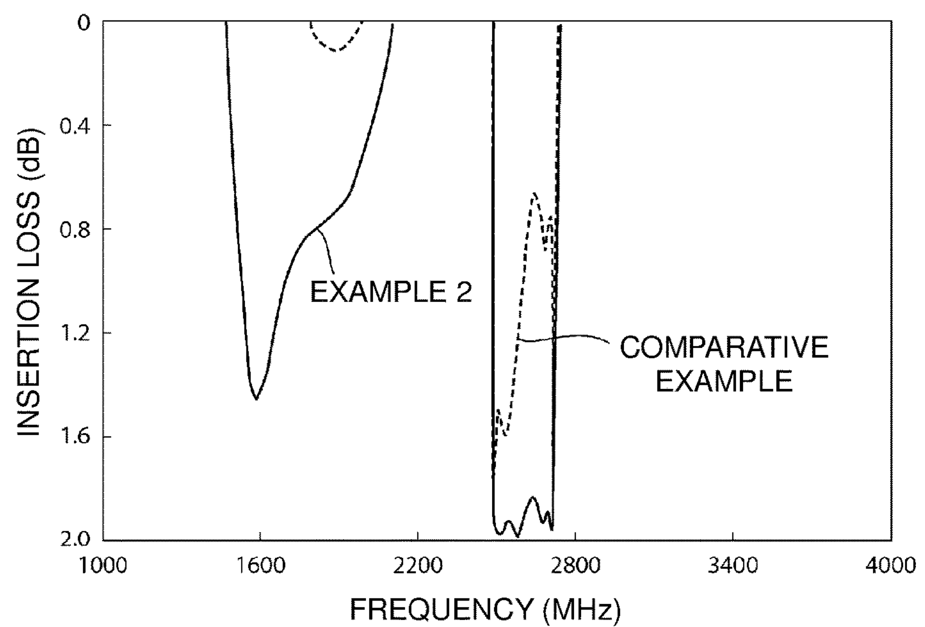
FIG. 7 is a diagram illustrating VSWR characteristics of Example 2 and a comparative example.
Figure 8:
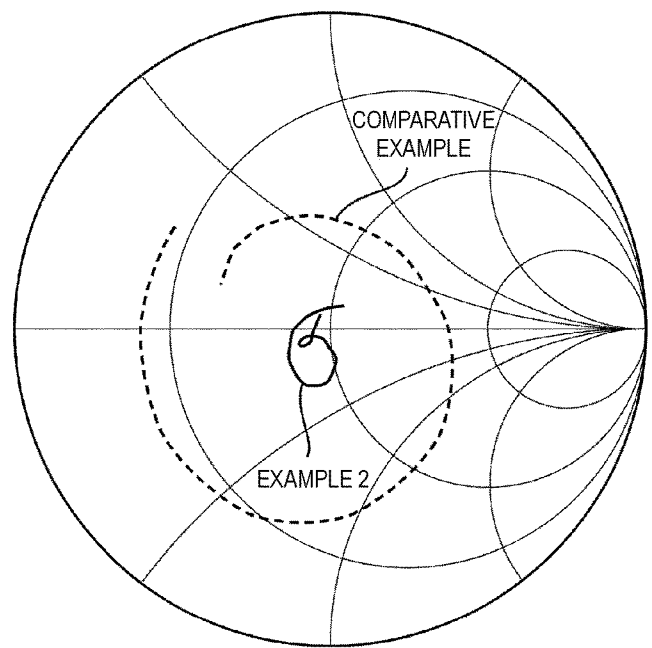
FIG. 8 is a diagram illustrating an impedance Smith chart of Example 2 and the comparative example.

The attenuation frequency characteristics of the filter apparatuses of Example 2 and the comparative example described above are illustrated in FIG. 6. FIG. 7 illustrates the reflection characteristics, as VSWR characteristics, when the first ladder circuit 101 is seen from the connection port 902 side. Further, an impedance Smith chart as seen from the input terminal side is illustrated in FIG. 8.

Figure 6:
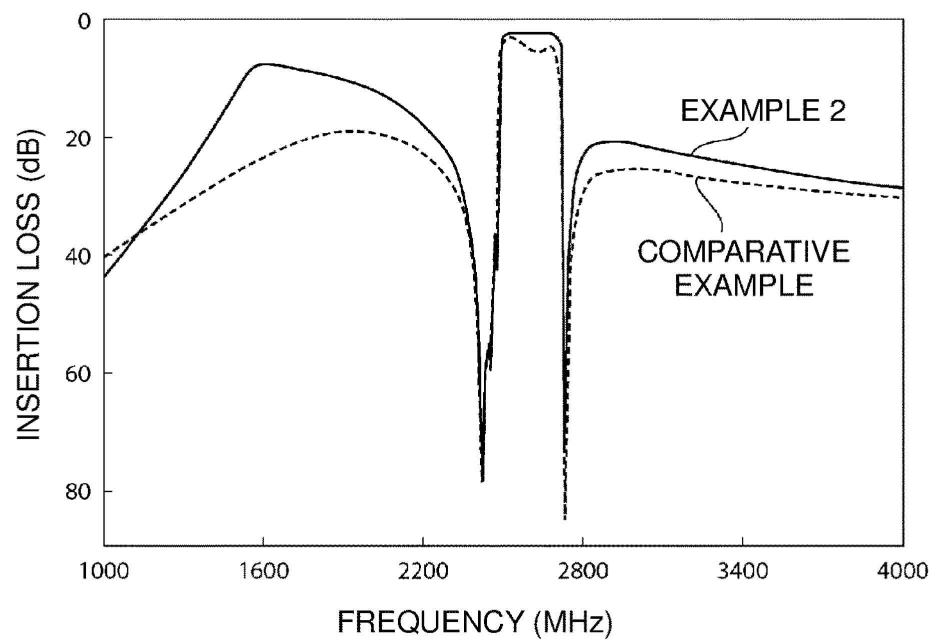
FIG. 6 is a diagram illustrating attenuation frequency characteristics of a filter apparatus of Example 2 as an example of the second preferred embodiment of the present invention and a filter apparatus of a comparative Example.

As is clear from FIG. 6, compared with the comparative example, the insertion loss within the pass band is able to be reduced according to Example 2. Further, it is seen that a ripple within the pass band is also to be reduced.

As is clear from FIG. 7, in the comparative example that does not include the common inductor 300, it can be seen that the impedance becomes capacitive and the impedance matching is not performed. On the other hand, in Example 2, it is thought that the impedance matching is made to be favorable by connection of the common inductor 300 and, hence, the insertion loss within the pass band becomes favorable as described above and the ripple is small, such that the VSWR characteristics are improved.

Further, as is clear from FIG. 7, it can be seen that the VSWR characteristics is significantly improved according to Example 2, compared with the comparative example.

As is clear from FIG. 8, according to Example 2, impedance matching is sufficiently performed at the input terminal side compared with the comparative example. Note that, according to Example 2, impedance matching has become sufficiently favorable also on the output end side compared with the comparative example, although the figure is omitted.

Hence, as is clear from the results of Example 2, also in the filter apparatus 2 of the second preferred embodiment, it can be seen that the filter characteristics is able to be made to be sufficiently favorable even in the case where the pass band has been widened.

In addition, the second inductor of the first ladder circuit 101 and the first inductor of the second ladder circuit 201 have been integrated into a common inductor in the second preferred embodiment. Hence, the size the filter apparatus 2 is able to be reduced. Further, a reduction in the number of components is able to be realized. In addition, variation in insertion loss due to variation in inductance values is able to be reduced since the number of inductors used is reduced.

Note that it is preferable that the impedance of the first ladder circuit 101 and the impedance of the second ladder circuit 201 be the complex conjugate of each other. In this case, a circuit to match the impedance of the first ladder circuit 101 and the impedance of the ladder circuit 201 can be omitted. Hence, a further reduction in size is able to be realized. In addition, loss due to impedance mismatching is able to be further reduced, such that insertion loss within the pass band is able to be further reduced. Further, integration of the second inductor and the first inductor into a common inductor as in the common inductor 300 of the second preferred embodiment is able to be easily performed.

Figure 9:
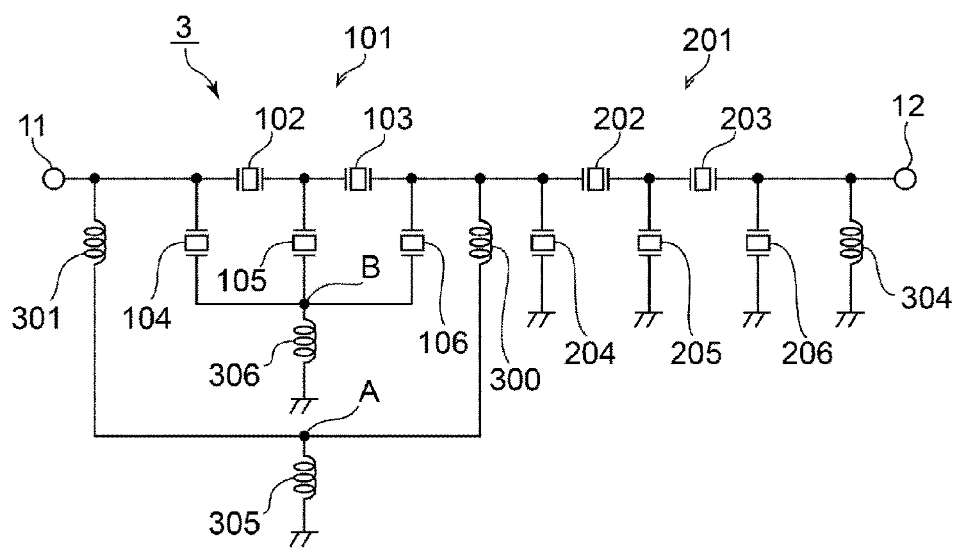
FIG. 9 is a circuit diagram of a filter apparatus according to a third preferred embodiment of the present invention.

FIG. 9 is a circuit diagram of a filter apparatus 3 of a third preferred embodiment of the present invention. The filter apparatus 3 includes the ladder circuit 101 and the ladder circuit 201, similarly to the filter apparatuses 1 and 2 of the first and second preferred embodiments. The common inductor 300 is shared by the first ladder circuit 101 and the second ladder circuit 201. In other words, the filter apparatus 3 has a circuit configuration similar to that of the filter apparatus 2. The filter apparatus 3 is different from the filter apparatus 2 in terms of the following points.

First, the ground-potential-side end portions of the plurality of parallel arm resonators 104-106 are commonly connected to one another at a second common connection point B. A fourth inductor 306 is connected between the second common connection point B and the ground potential.

The ground-potential-side end portions of the first inductor 301 and the common inductor 300, which operates also as the second inductor, are connected to a first common connection point A. A third inductor 305 is connected between the first common connection point A and the ground potential, and the first inductor 301 and the common inductor 300 are magnetically coupled to each other. The rest of the configuration of the filter apparatus 3 is the same as that of the filter apparatus 2 and, hence, identical portions are denoted by the same reference numerals and descriptions thereof are omitted.

Figure 10:
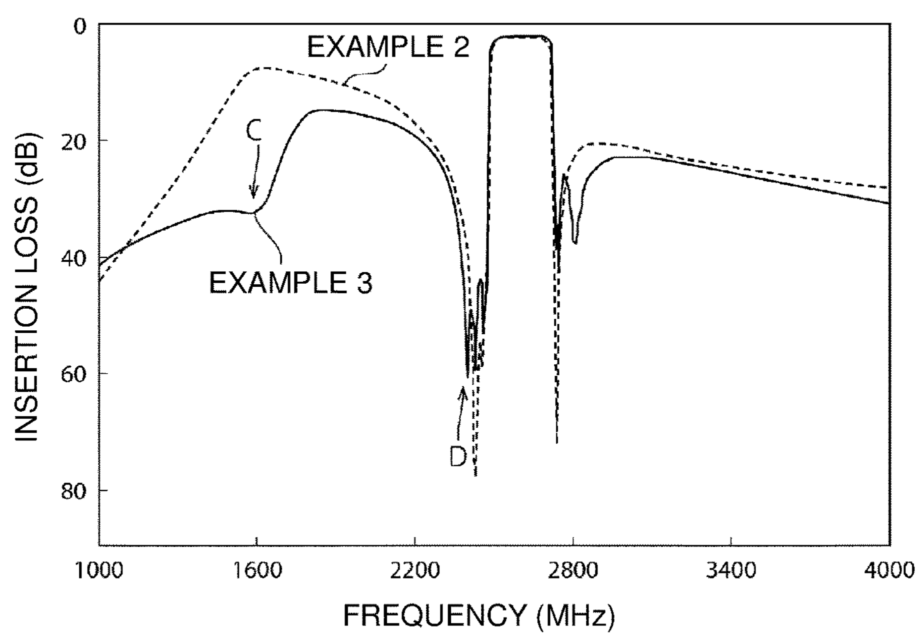
FIG. 10 is a diagram illustrating attenuation frequency characteristics of Example 3 as an example of the third preferred embodiment of the present invention and attenuation frequency characteristics of Example 2.

Also in the filter apparatus 3 of the present preferred embodiment, since the filter apparatus 3 has a configuration in which the first ladder circuit 101 and the second ladder circuit 201 are connected to each other, insertion loss within the pass band is able to be reduced and the VSWR characteristics are made to be favorable, and further, a ripple in the pass band is unlikely to be generated, similarly to the filter apparatuses 1 and 2 of the first and second preferred embodiments, even in the case where the pass band has been widened. In addition, attenuation in the attenuation ranges outside of the pass band is able to be increased in the filter apparatus 3, compared with the filter apparatus 2. This is illustrated in FIG. 10. A solid line in FIG. 10 represents the attenuation frequency characteristics of Example 3 of the filter apparatus 3 and a broken line represents the attenuation frequency characteristics of Example 2. The attenuation frequency characteristics of Example 2 are the attenuation frequency characteristics of Example 2 illustrated by the solid line in FIG. 6.

Regarding Example 3, a filter apparatus was formed similarly to Example 2. However, the design parameters of the series arm resonators, the parallel arm resonator, and the inductors in the present preferred embodiment are those illustrated in Table 5 and Table 6 described below.

TABLE 5

| | SERIES ARM RESONATORS | | PARALLEL ARM RESONATORS | | | SERIES ARM RESONATORS | | PARALLEL ARM RESONATORS | | |
|---|---|---|---|---|---|---|---|---|---|---|
| | 102 | 103 | 104 | 105 | 106 | 202 | 203 | 204 | 205 | 206 |
| CAPACITANCE (pF) | 1.8 | 2.7 | 1.6 | 1.0 | 1.2 | 2.0 | 1.5 | 1.2 | 1.5 | 1.3 |
| RESONANT FREQUENCY (MHz) | 2655 | 2652 | 2421 | 2476 | 2455 | 2655 | 2663 | 2456 | 2470 | 2435 |

TABLE 6

| INDUCTOR | 301 | 300 | 304 | 305 | 306 |
|---|---|---|---|---|---|
| INDUCTANCE VALUE (nH) | 1.7 | 1.2 | 2.4 | 0.27 | 0.1 |

As is clear from FIG. 10, it can be seen that also in Example 3, the insertion loss is small in the pass band and a ripple does not appear. In addition, it can be seen that attenuation in an attenuation range of 1-2.2 GHz and attenuation in the WiFi band of 2.4-2.5 GHz have been increased as indicated by the arrows C and D, compared with Example 2. The reason why such an improvement effect has been obtained is thought to be as follows.

It is thought that the reason why the attenuation near 1-2.2 GHz has been increased is generation of new attenuation poles in the vicinity. In other words, this is because the value of the third inductor 305 and the degree of magnetic coupling between the first inductor 301 and the common inductor 300 have been adjusted so that an attenuation pole is generated in the frequency band described above. Note that the frequency of the attenuation pole need only be lower than the center frequency of the pass band, not limited to the frequency band described above. As a result, attenuation of frequencies where the attenuation pole is formed is able to be increased. Further, the improvement of attenuation in the WiFi band of 2.4-2.5 GHz is due to the fact that the resonant frequencies of the parallel arm resonators 104-106 are shifted to lower frequencies by the fourth inductor 306.

In the preferred embodiments described above, the filter apparatuses 1, 2, and 3 preferably having two-stage configurations have been described. However, in the present invention, three or more stages of ladder circuits may be connected between the input terminal 11 and the output terminal 12. Preferably, as described above, among neighboring ladder circuits, the impedance of one of them and the impedance of the other is the complex conjugate of each other. In that case, the impedance matching is able to be made even more favorable. In this case, when three or more ladder circuits are connected, it is only required that the above-described complex-conjugate relationship be realized in at least one of portions between neighboring ladder circuits. More preferably, when three or more ladder circuits are connected, it is desirable that the above-described complex-conjugate relationship be realized in all the connection portions between neighboring ladder circuits. Specifically, examples of the method to achieve the above-described complex-conjugate relationship include a method of adjusting the impedance and inductor values of the series arm resonators and parallel arm resonators in a ladder circuit.

In the filter apparatus 3, the parallel arm resonators 104-106 are connected to one another at the common connection point B. Similarly, also in the parallel arm resonators 204-206, the ground-potential-side end portions may be connected to one another at a common point. This will allow out-of-band attenuation to be further increased. A configuration may be used in which only the parallel arm resonator 104 and the parallel arm resonator 105 among the parallel arm resonators 104-106 are connected to each other so as to be connected to the fourth inductor 306. In other words, it is only required that among the plurality of parallel arm resonators, the ground-potential-side end portions of at least two parallel arm resonators be connected to each other at the common point.

Although the first inductor 301 and the common inductor 300 preferably are magnetically coupled to each other in the filter apparatus 3, the common inductor 300 and the second inductor 304 may be magnetically coupled to each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter apparatus comprising:

an input terminal;

an output terminal; and a plurality of stages of ladder circuits connected between the input terminal and the output terminal; wherein a band width ratio is about 4.3% or higher; and a ladder circuit of each stage of the plurality of stages of ladder circuits includes:

a first end portion;

a second end portion;

a series arm resonator provided on a series arm connecting the first end portion and the second end portion to each other;

a parallel arm resonator provided on a parallel arm connecting the series arm to a ground potential;

a first inductor connected between the first end portion and the ground potential; and a second inductor connected between the second end portion and the ground potential.

2. The filter apparatus according to claim 1, wherein in the ladder circuits neighboring each other among the plurality of stages of ladder circuits, the second inductor of one of the ladder circuits and the first inductor of the other of the ladder circuits are integrated into a single common inductor.

3. The filter apparatus according to claim 2, wherein the single common inductor and the first inductor are magnetically coupled to each other.

4. The filter apparatus according to claim 2, wherein the single common inductor and the second inductor are magnetically coupled to each other.

5. The filter apparatus according to claim 1, wherein the filter apparatus includes the plurality of stages of ladder circuits with impedances that are a complex conjugate of each other.

6. The filter apparatus according to claim 1, wherein a ground-potential-side end portion of the first inductor and a ground-potential-side end portion of the second inductor are commonly connected to each other at a first common connection point and a third inductor is connected between the first common connection point and the ground potential such that the first inductor and the second inductor are magnetically coupled to each other.

7. The filter apparatus according to claim 6, wherein a frequency of an attenuation pole generated by the magnetic coupling between the first inductor and the second inductor is lower than a center frequency of a pass band.

8. The filter apparatus according to claim 1, wherein the plurality of stages of ladder circuits are connected in series between the input terminal and the output terminal.

9. The filter apparatus according to claim 1, wherein the series arm resonators and the parallel arm resonators are surface acoustic wave resonators or boundary acoustic wave resonators.

10. The filter apparatus according to claim 1, wherein impedance matching is performed at the input terminal and the output terminal, and impedance matching is performed at the second end portion.

11. The filter apparatus according to claim 1, wherein an inductance of the first inductor is 2.0 nH and an inductance of the second inductor is about 2.0 nH.

12. The filter apparatus according to claim 1, wherein the filter apparatus has a two-stage configuration.

13. The filter apparatus according to claim 1, wherein filter apparatus has a configuration with three or more stages.

14. The filter apparatus according to claim 1, wherein the ladder circuit of each stage of the plurality of stages of ladder circuits includes a plurality of the parallel arms;

each of the parallel arms includes the parallel arm resonator provided thereon;

ground-potential-side end portions of the parallel arm resonators provided on at least two of the parallel arms are commonly connected to one another at a second common connection point; and a fourth inductor is connected between the second common connection point and the ground potential.

15. The filter apparatus according to claim 1, wherein the series arm resonators and the parallel arm resonators are elastic wave resonators.

* * * * *